United States Patent
Kellar et al.

(10) Patent No.: US 6,661,085 B2
(45) Date of Patent: Dec. 9, 2003

(54) BARRIER STRUCTURE AGAINST CORROSION AND CONTAMINATION IN THREE-DIMENSIONAL (3-D) WAFER-TO-WAFER VERTICAL STACK

(75) Inventors: Scot A. Kellar, Bend, OR (US); Sarah E. Kim, Portland, OR (US); R. Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 10/066,668

(22) Filed: Feb. 6, 2002

(65) Prior Publication Data

US 2003/0148590 A1 Aug. 7, 2003

(51) Int. Cl.$^7$ ................................................ H01L 23/02
(52) U.S. Cl. ........................ 257/686; 257/687; 257/723; 257/727
(58) Field of Search ............................ 438/12, 51, 455, 438/458, 459, 975, 977, 107, 109; 257/686, 687, 723, 724, 717

(56) References Cited

U.S. PATENT DOCUMENTS

| | | | | |
|---|---|---|---|---|
| 4,689,113 A | * | 8/1987 | Balasubramanyam et al. | 438/631 |
| 5,241,450 A | * | 8/1993 | Bernhardt et al. | 361/689 |
| 5,366,906 A | * | 11/1994 | Wojnarowski et al. | 438/17 |
| 5,419,806 A | * | 5/1995 | Huebner | 216/20 |
| 5,880,010 A | * | 3/1999 | Davidson | 438/455 |
| 6,255,726 B1 | * | 7/2001 | Vindasius et al. | 257/686 |
| 6,355,501 B1 | * | 3/2002 | Fung et al. | 438/107 |
| 6,355,976 B1 | * | 3/2002 | Faris | 257/686 |

OTHER PUBLICATIONS

"Ultra Thin Electronics for Space Applications", 2001 Electronic Components and Technology Conference, 2001 IEEE.

"Copper Wafer Bonding"; A. Fan, A. Rahman, and R. Reif; Electrochemical and Solid–State Letters, 2 (10) 534–536 (1999).

"Face to Face Wafer Bonding for 3D Chip Stack Fabrication to Shorten Wire Lengths", Jun. 27–29, 2000 VMIC Conference 2000 IMIC—200/00/0090(c).

"InterChip Via Technology for Vertical System Integration", Fraunhofer Institute for Reliability and Microintegration, Munich, Germany; Infineon Technologies AG, Munich, Germany; 2001 IEEE.

* cited by examiner

Primary Examiner—Michael S. Lebentritt
(74) Attorney, Agent, or Firm—Antonelli, Terry, Stout & Kraus, LLP

(57) ABSTRACT

A three-dimensional (3-D) integrated chip system is provided with a first wafer including one or more integrated circuit (IC) devices, metallic lines deposited via an interlevel dielectric (ILD) on a surface, and at least one barrier line deposited on an outer edge of the surface; and a second wafer including one or more integrated circuit (IC) devices, metallic lines deposited via an interlevel dielectric (ILD) on a surface, and at least one barrier line deposited on an outer edge of the surface, wherein the metallic lines and the barrier line deposited on the surface of the second wafer are bonded with the metallic lines and the barrier line deposited on the surface of the first wafer to establish electrical connections between active IC devices on adjacent wafers and to form a barrier structure on the outer edge of the adjacent wafers.

14 Claims, 6 Drawing Sheets

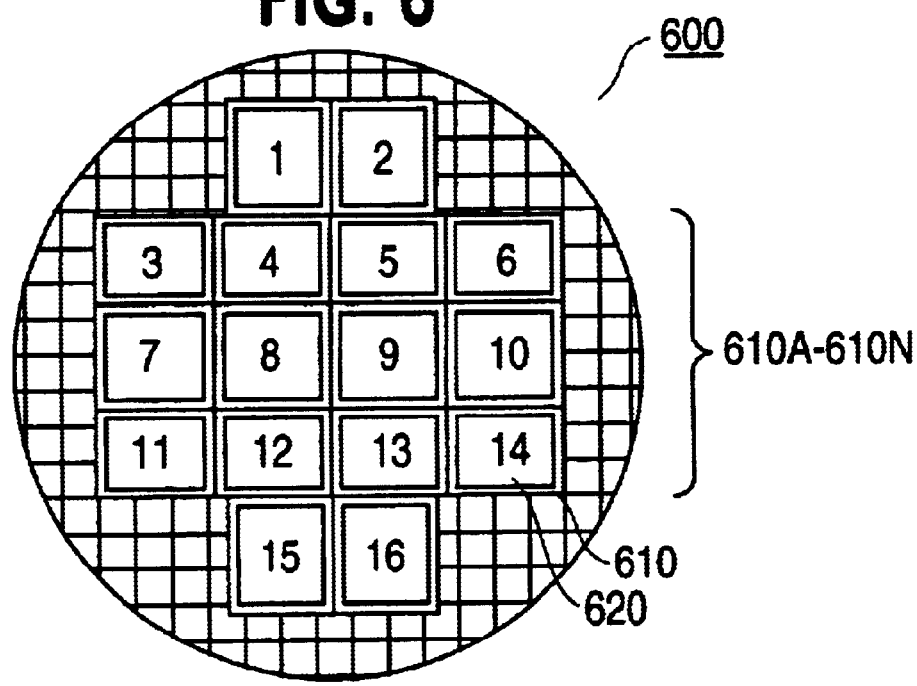
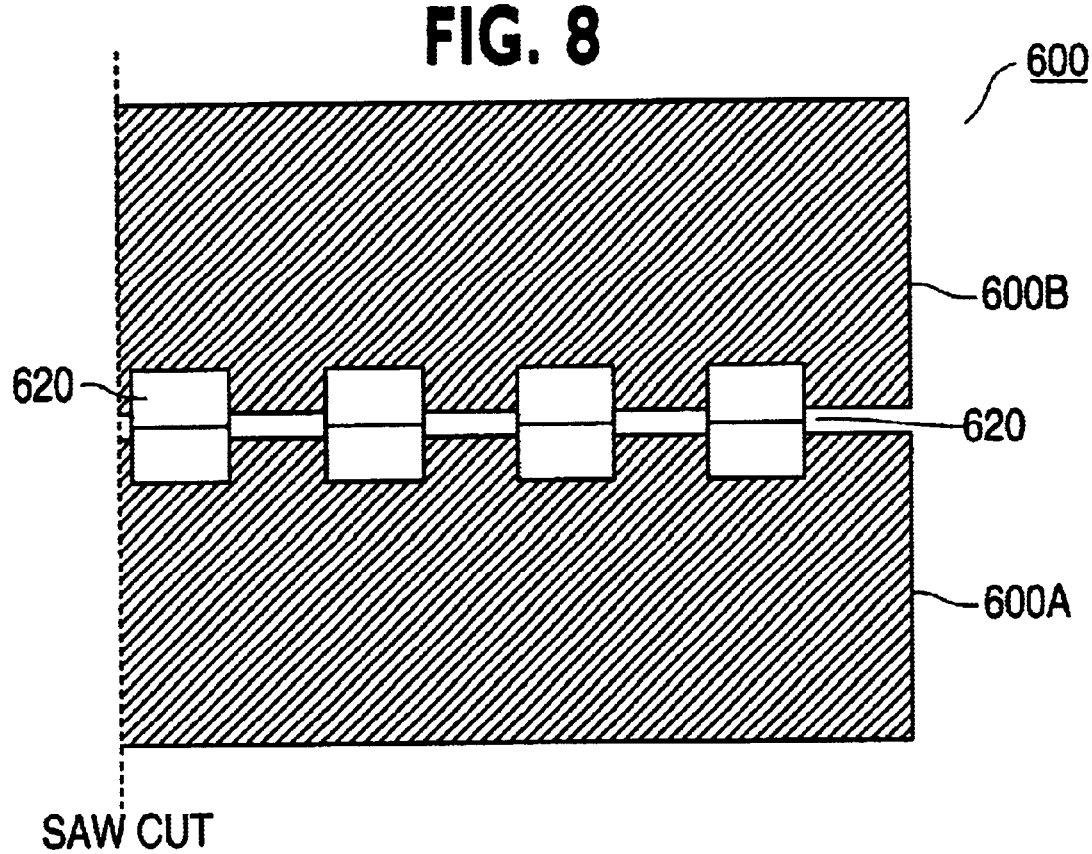

US 6,661,085 B2

BARRIER STRUCTURE AGAINST CORROSION AND CONTAMINATION IN THREE-DIMENSIONAL (3-D) WAFER-TO-WAFER VERTICAL STACK

TECHNICAL FIELD

The present invention relates to a semiconductor process and, more specifically, relates to a barrier structure on the outer edge of bonded wafers including individual die for protection from corrosion and contamination in a three-dimensional (3-D) wafer-to-wafer vertical stack.

BACKGROUND

Integrated circuits (ICs) form the basis for many electronic systems. Essentially, an integrated circuit (IC) includes a vast number of transistors and other circuit elements that are formed on a single semiconductor wafer or chip and are interconnected to implement a desired function. The complexity of these integrated circuits (ICs) requires the use of an ever increasing number of linked transistors and other circuit elements.

Many modern electronic systems are created through the use of a variety of different integrated circuits; each integrated circuit (IC) performing one or more specific functions. For example, computer systems include at least one microprocessor and a number of memory chips. Conventionally, each of these integrated circuits (ICs) is formed on a separate chip, packaged independently and interconnected on, for example, a printed circuit board (PCB).

As integrated circuit (IC) technology progresses, there is a growing desire for a "system on a chip" in which the functionality of all of the IC devices of the system are packaged together without a conventional PCB. Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic and memory chip, one on top of the other in an arrangement commonly referred to as chip-on-chip structure. Subsequently, multi-chip module (MCM) technology has been utilized to stack a number of chips on a common substrate to reduce the overall size and weight of the package, which directly translates into reduced system size.

Existing multi-chip module (MCM) technology is known to provide performance enhancements over single chip or chip-on-chip (COC) packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to the increased system speed and reliability, and the reduced weight, volume, power consumption and heat to be dissipated for the same level of performance. However, MCM approaches still suffer from additional problems, such as bulky package, wire length and wire bonding that gives rise to stray inductances that interfere with the operation of the system module.

An advanced three-dimensional (3D) wafer-to-wafer vertical stack technology has been recently proposed by researchers to realize the ideal high-performance "system on a chip" as described in *"Face To Face Wafer Bonding For 3D Chip Stack Fabrication To Shorten Wire Lengths"* by J. F. McDonald et al., Rensselaer Polytechnic Institute (RPI) presented on Jun. 27–29, 2000 VMIC Conference, and *"Copper Wafer Bonding"* by A. Fan et al., Massachusetts Institute of Technology (MIT), Electrochemical and Solid-State Letters, 2 (10) 534–536 (1999). In contrast to the existing multi-chip module (MCM) technology which seeks to stack multiple chips on a common substrate, 3-D wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance.

One major challenge of 3-D wafer-to-wafer vertical stack integration technology is the metal bonding between wafers and between die in a single chip and the wafer protection from possible corrosion and contamination caused or generated by process steps after the wafers are bonded from reaching active IC devices on the bonded wafers. Therefore, a need exists to erect a barrier structure on the outer edge of bonded wafers and individual die to protect the bonded wafers and die against corrosion and contamination in a three-dimensional (3-D) wafer-to-wafer vertical stack.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein:

FIG. 6 illustrates a top view of an example bonded wafer pair including a plurality of individual die and a barrier structure on an outer edge of bonded die according to another embodiment of the present invention;

FIG. 8 illustrates a cross-sectional view of an example individual die pair including a barrier structure on an outer edge of bonded die according to an embodiment of the present invention.

DETAILED DESCRIPTION

The present invention is applicable for use with all types of semiconductor wafers and integrated circuit (IC) devices, including, for example, MOS transistors, CMOS devices, MOSFETs, and new memory devices and communication devices such as smart card, cellular phone, electronic tags, gaming devices which may become available as semiconductor technology develops in the future. However, for the sake of simplicity, discussions will concentrate mainly on exemplary use of a dielectric recess for metallic wafer-to-wafer and die-to-die bonding in a three-dimensional (3-D) wafer-to-wafer vertical stack, although the scope of the present invention is not limited thereto.

Figure 1A:
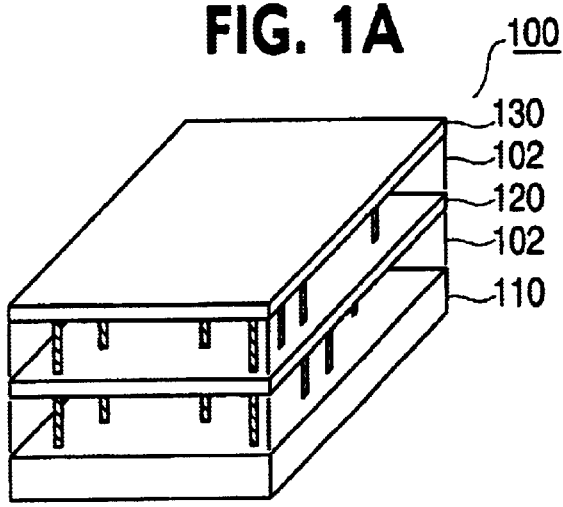
FIGS. 1A–1B illustrate an example three-dimensional (3-D) wafer-to-wafer vertical stack forming a single chip.
Figure 1B:
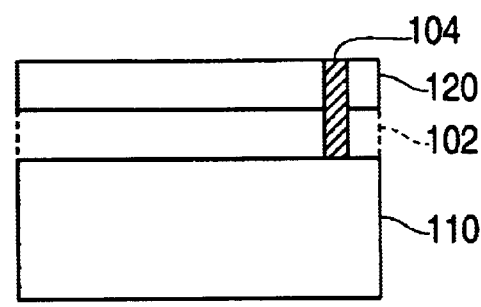

Attention now is directed to the drawings and particularly to FIGS. 1A–1B, an example three-dimensional (3-D) wafer-to-wafer vertical stack of a single chip (individual die) is illustrated. As shown in FIG. 1A, the 3-D vertical stack (chip) 100 may comprise any number of active device polysilicon (Si) wafers, such as wafer #1 110 which includes an active device layer for supporting, for example, one or more microprocessors; wafer #2 120 which includes an active device layer for supporting one or more memory devices; and wafer #3 130 which includes an active device layer for supporting one or more radio-frequency (RF) or optical communication devices. The bottom wafer 110 is typically thick to support the stacking of the top wafers 120 and 130, while the top wafers 120 and 130 are thinned to minimize interconnection lengths between wafers 110, 120 and 130.

In a typical 3-D vertical stack 100 shown in FIGS. 1A–1B, the active device wafers 110, 120 and 130 are bonded using an interlevel dielectric (ILD) layer 102, while all active layers on wafers 110, 120 and 130 may be electrically interconnected using vertical vias 104. The dielectric (ILD) layer 102 may be a dielectric glue or a polymer adhesive such as polyimide and epoxy, to bond wafers 110, 120 and 130 at low curing temperature ranging from 150 to 400° C. for example, while maintaining electrical isolation between active IC devices of silicon (Si) wafers 110, 120 and 130. However, other bonding adhesive such as borophosphosilicate glass (BPSG) may also be used to facilitate the wafer bonding process. Interwafer vias 104 may then be etched through the ILD at arbitrary locations, the thinned top Si wafers 120 and 130, and the cured dielectric layer 102 for providing vertical electrical interconnects between active IC devices of the bottom wafer 110 and the top wafers 120 and 130.

Typically, the interwafer vias 104 are prepared on the top wafer 120 as shown in FIG. 1B, for example, by etching through the dielectric (ILD) layer 102. The top wafer 120 is then adhesively bonded to the handling bottom wafer 110 and thinned with high uniformity until the trenches are opened. After the bonding process, the bottom wafer 100 may be removed, leaving the desired wafer stack that can be further processed like a standard silicon (Si) wafer. The interwafer vias 104 are opened to a standard metallization (typically using Aluminum "Al") and passivation.

However, there are still limitations regarding the use of dielectric (ILD) layer 102 and interwafer vias 104 in direct 3-D integration. For example, the interwafer vias 104 between adjacent wafers 110 and 120 is typically deep which lead to some interconnect RC delay in active IC devices. In addition, the dielectric (ILD) layer 102 used for wafer bonding can also be cost-prohibitive for mass production.

In order to reduce the use of dielectric (ILD) layers 102 between adjacent wafers 110, 120 and 130, and to minimize the interconnect RC delay in active IC devices through the interwafer vias 106, proposals have been made to use metallic lines (metal bonding pads) arranged on the surface of adjacent wafers 110, 120 and 130 to serve not only as electrical connections to active IC devices on adjacent wafers 110, 120 and 130 on a 3-D wafer-to-wafer vertical stack 100 but also to bond the adjacent wafers 110, 120 and 130. In addition, dummy metal bonding pads can also be made to increase the surface area for wafer bonding and serve as auxiliary structures such as ground planes or heat conduits for the active IC devices.

Figure 2:
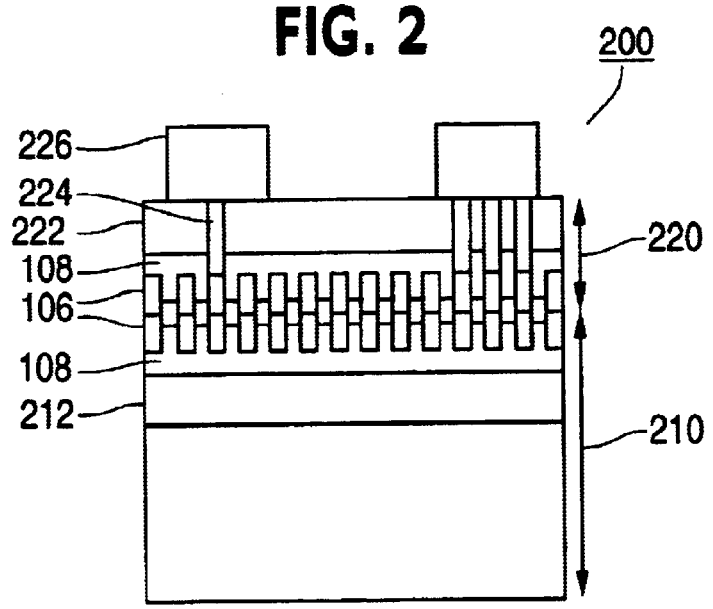
FIG. 2 illustrates an example three-dimensional (3-D) wafer-to-wafer vertical stack according to an embodiment of the present invention.
Figure 3:
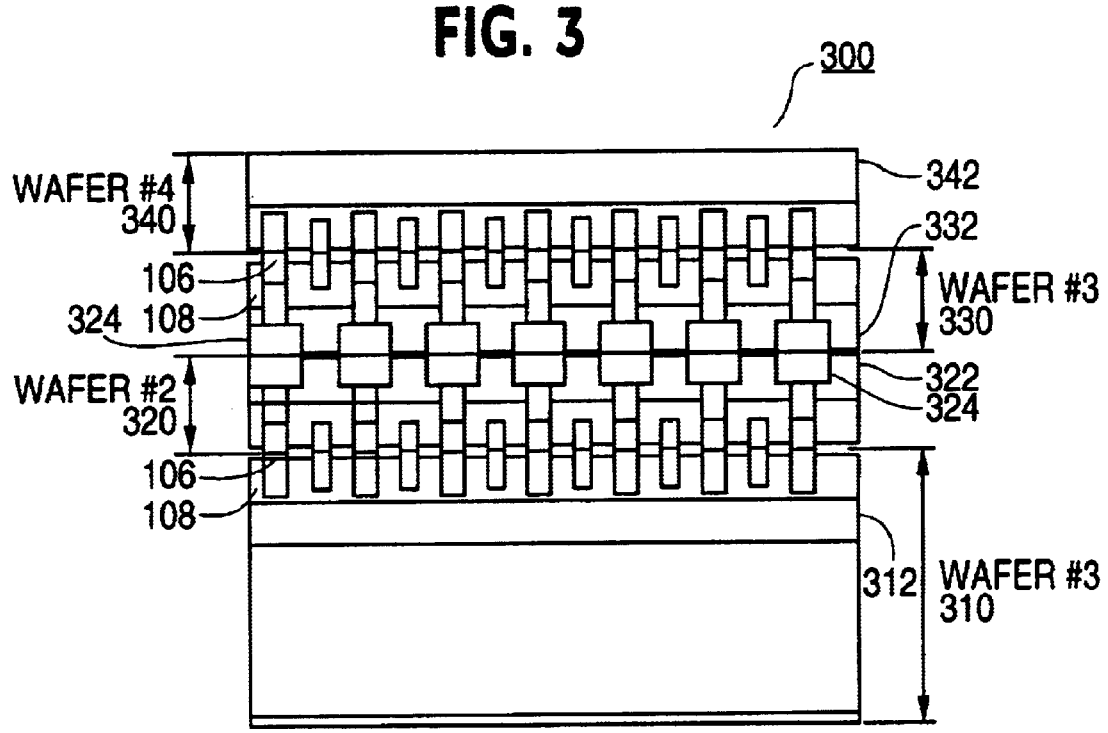
FIG. 3 illustrates another example three-dimensional (3-D) wafer-to-wafer vertical stack according to an embodiment of the present invention.

Turning now to FIGS. 2–3, various example three-dimensional (3-D) wafer-to-wafer vertical stacks according to an embodiment of the present invention are illustrated. Specifically, FIG. 2 illustrates an example 2-wafer vertical stack 200 (individual die) according to an embodiment of the present invention; and FIG. 3 illustrates an example 4-wafer vertical stack 300 (individual die) according to an embodiment of the present invention. However, the number of wafers to be bonded in a vertical stack is not limited thereto. Both the 2-wafer vertical stack 200 shown in FIG. 2, and the 4-wafer vertical stack shown in FIG. 3 indicate individual die (chip) after the entire bonded Si wafers are cut after the manufacturing process.

As shown in FIG. 2, the bottom silicon (Si) wafer 210 contains an active device layer 212 supporting one or more active IC devices (not shown). Likewise, the top Si wafer 220 also contains an active device layer 222 supporting one or more active IC devices (not shown). The wafers 210 and 220 may be aligned using a standard alignment tool and bonded, via a metal bonding layer 106 deposited on opposing surfaces of the bottom wafer 210 and the top wafer 220 at designated bonding areas to establish electrical connections between active IC devices on adjacent wafers 210 and 220 and to bond the adjacent wafers 210 and 220, while maintaining electrical isolation between metal bonding areas via an ILD layer 108. One or more vertical vias 224 may be etched, via the top wafer 220, to establish electrical connections of active IC devices to an external interconnect, via a C4 bump 226. The top wafer 220 can also be thinned so as to be much more pliable than those of standard thickness and to allow for greater thickness variations across the wafers 210 and 220 for the same applied bonding pressure.

The metal bonding process may be performed in a vacuum and, as a result, dielectric recess can be created to surround the metal bonding areas to facilitate direct metal bonding between adjacent wafers or between die to ensure that adjacent wafers (210 and 220 shown in FIG. 2, or 310, 320, 330 and 340 shown in FIG. 3) are bonded, while maintaining electrical isolation between the metal bonding areas. The metal bonding layer 106 may include a plurality of Copper (Cu) lines on opposing surfaces of both wafers 210 and 220 that can serve as electrical contacts between active IC devices on both wafers 210 and 220. Copper (Cu) may be selected because of its low electrical resistivity, high electromigration resistance and high diffusivity. Therefore, copper (Cu) can be used for metal diffusion bonding in contrast with the commonly used Aluminum (Al). However, other metallic materials can also be used, including, for example, gold, nickel, silver, palladium, palladium-nickel alloy, titanium, or titanium nitride or any combination thereof.

In an example 4-wafer vertical stack 300 shown in FIG. 3, each of the silicon (Si) wafers 310, 320, 330 and 340 contains a respective active device layer 312, 322, 332 and 342 supporting one or more active IC devices (not shown). Wafer #1 310 and wafer #2 320 may be aligned and bonded via a metal bonding layer 106 deposited on opposing surfaces of the wafers #1 310 and #2 320 at designated bonding areas to establish electrical connections between active IC devices on adjacent wafers 310 and 320 and to bond the adjacent wafers 310 and 320, while maintaining electrical isolation between bonding areas via an ILD layer 108. Wafer #3 330 may then be aligned and bonded on the top surface of wafer #2 320, via vertical vias 324. Wafer #4 340 may be aligned and bonded on the top surface of wafer #3 330, via the same metal bonding layer 106 deposited on opposing surfaces of the wafers #3 330 and #4 340 at designated bonding areas to establish electrical connections between active IC devices on adjacent wafers 330 and 340 and to concurrently bond the adjacent wafers 330 and 340, while maintaining electrical isolation between bonding areas via an ILD layer 108.

Figure 4A:
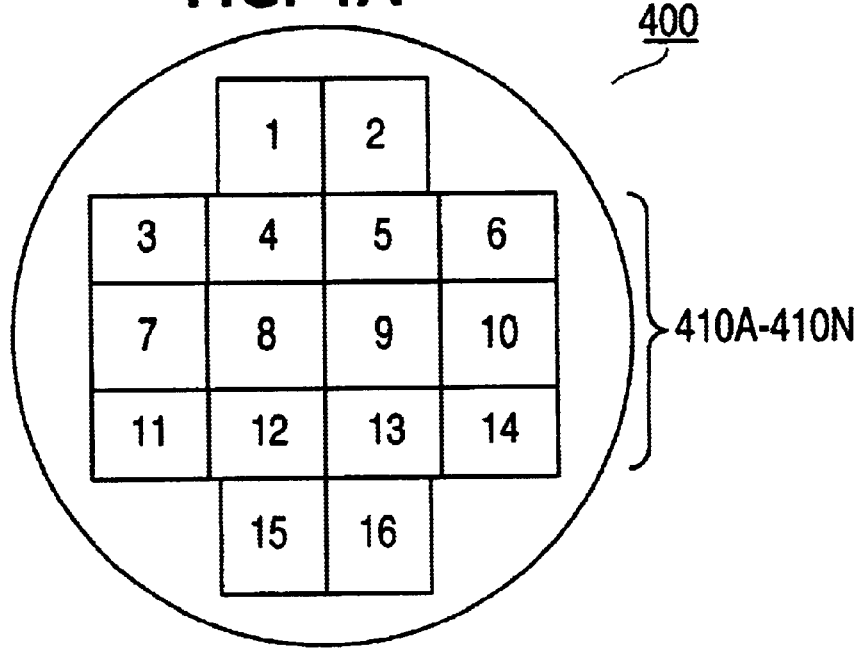
FIGS. 4A–4B illustrate an example bonded wafer pair including a plurality of individual die.
Figure 4B:
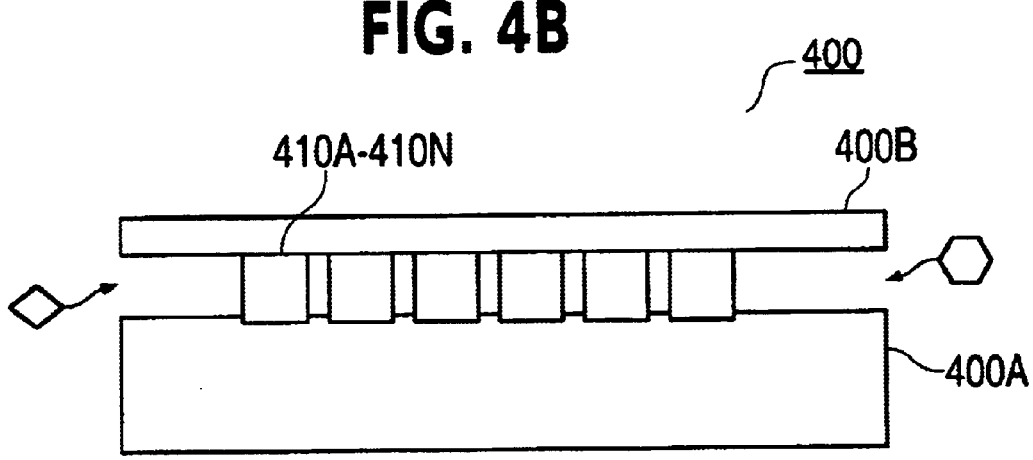

FIGS. 4A–4B illustrate an example bonded wafer pair including a plurality of individual die. As shown in FIG. 4A the entire wafer 400 may contain many individual die 410A–410N as previously described, such as die #1 to #16 for example. However, after two or more Si wafers 400A–400B have been bonded together to form a bonded wafer pair 400, as shown in FIG. 4B there exists a gap between the silicon surfaces of the top and bottom wafers 400A–400B which may allow contamination (for example, particles from Chemical Mechanical Polish "CMP" or grinding) from subsequent processing to reach the metal bonding areas and active regions of the internal die inside the wafer edge.

Figure 5A:
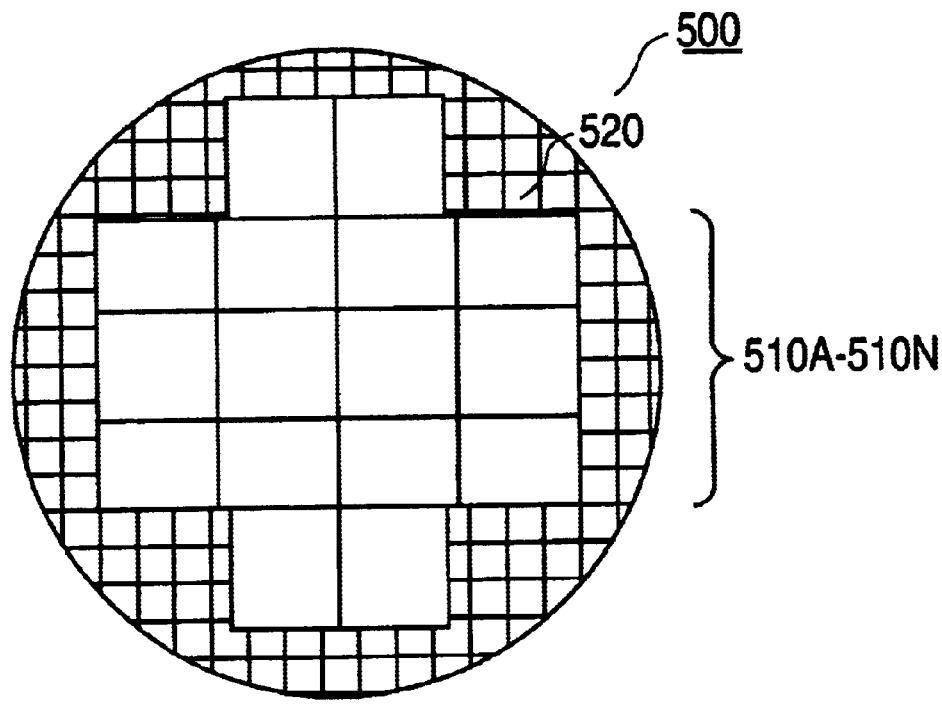
FIGS. 5A–5B illustrate a top view of an example bonded wafer pair including a plurality of individual die and a barrier structure on an outer edge of bonded wafers according to an embodiment of the present invention.
Figure 5B:
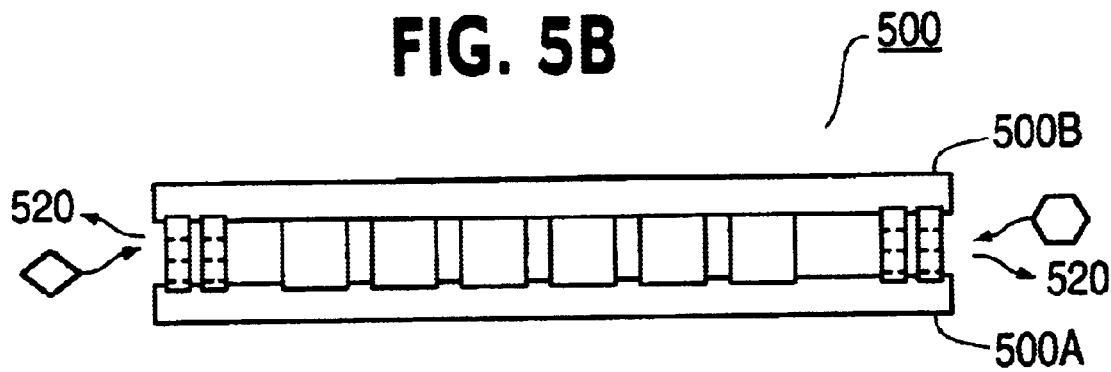

Turning now to FIGS. 5A–5B, example bonded wafer pairs including a plurality of individual die and a barrier structure on an outer edge of bonded wafers according to an embodiment of the present invention are illustrated. More specifically, FIG. 5A illustrates a top view of an example bonded wafer pair 500 including a plurality of individual die 510A–510N and a barrier structure 520 on an outer edge of bonded wafers. FIG. 5B illustrates a side view of an example bonded wafer pair 500 including a plurality of individual die 510A–510N and a barrier structure 520 on an outer edge of bonded wafers.

As shown in FIGS. 5A–5B, a barrier structure 520 can be advantageously erected on an outer edge of the bonded wafers 400A–400B to protect internal die 510A–510N such as die #1 to #16 from corrosion and contamination caused by wafer thinning techniques or generated by other processing steps after the wafers are bonded, and to provide additional structural support for crack propagation control when the bonded wafer pair 500 is cut into individual die. Such a barrier structure 520 may be patterned in the same litho step as the metal bonding pads and use the area on the outer edge of the wafer pair 500 that is unsuitable for die. In addition, the barrier structure 520 can be constructed in the same manner as the metal bonding pads including the dielectric recess, and the surface preparation prior to the metal bonding process so that the wafers 400A–400B are also bonded together at the wafer edges.

According to an embodiment of the present invention, the barrier structure 520 is a tight pitch, uniform metal grid (checkerboard pattern) with 80% metal density erected on the outer edge of the usable die of the wafer pair 500. Such a barrier structure 520 can be erected using a special edge reticle to create a dense grid of connected copper (Cu) lines. Copper (Cu) may be desired because of its low electrical resistivity, high electromigration resistance and high diffusivity. However, other metallic materials can also be used, including, for example, gold and tin and tin alloy. The barrier structure 520 may also be erected using the same reticle as used for the majority of the wafer to pattern just the wafer edges. However, the metal density may not be as high as with the special edge reticle and may leave a long path open between the interior and the edge of the wafer pair 500. As a result, the barrier structure 520 can dramatically improve the mechanical stability of the bonded wafer pair 500 by increasing the total bonding area and decreasing the effective lever arm by several orders of magnitude(2 um rather than 2 cm) that can work against the wafer edge when the bonded wafer pair 500 is cut into individual die.

Independently from the barrier structure 520 used for the entire wafer pair 500 at the wafer level as described with reference to FIGS. 5A–5B, an additional barrier structure can also be utilized at the die level to protect individual die from contamination, oxidation, resistance increase and even delamination. The die barrier structure can also protect the individual die from crack propagation when the entire wafer pair is cut into individual die, and preserve the mechanical and potential vacuum integrity of the die near the saw cut.

Figure 7:
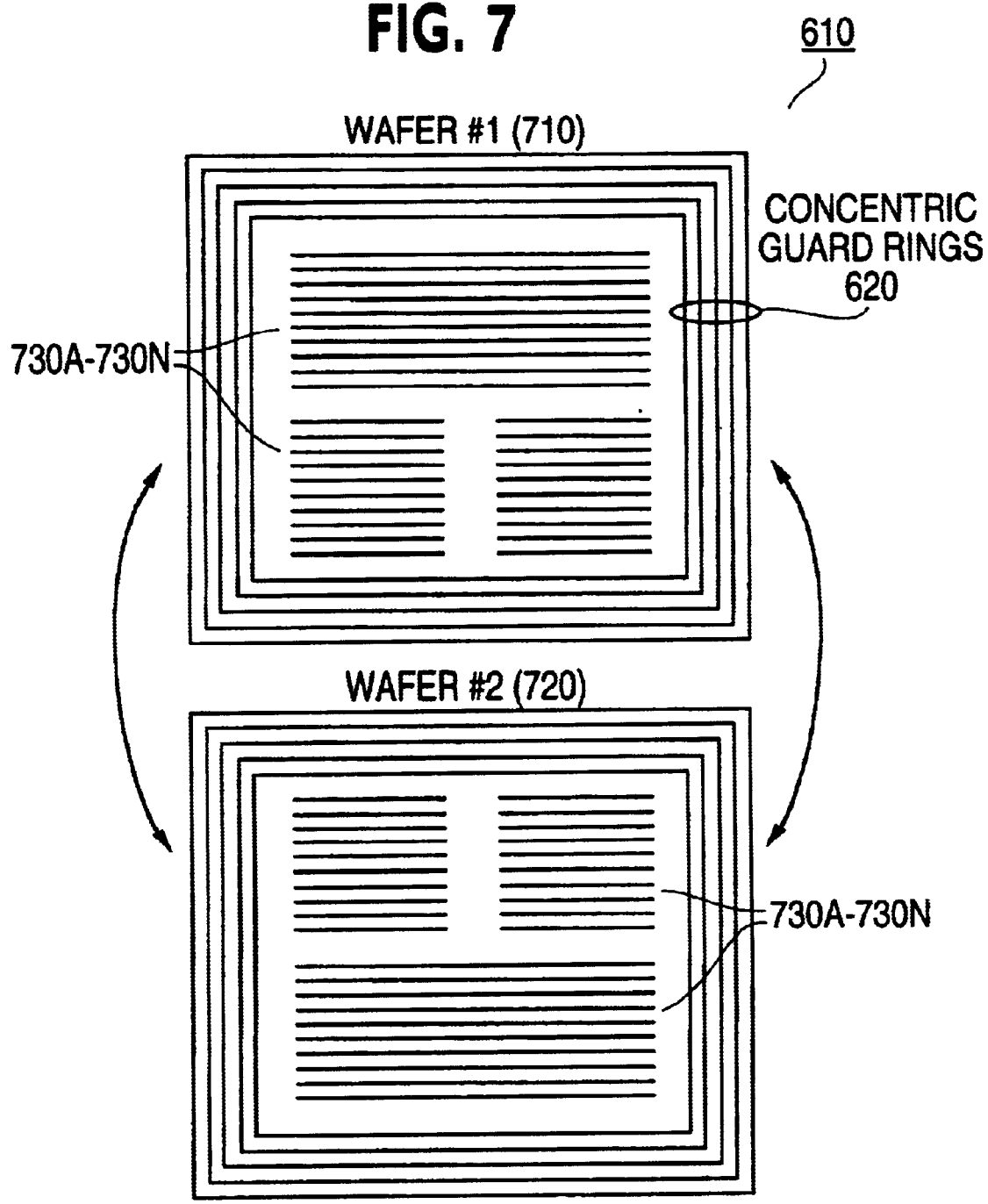
FIG. 7 illustrates a top view of an example individual die pair including a barrier structure on an outer edge of bonded die according to an embodiment of the present invention.

For example, FIG. 6 illustrates an example bonded wafer pair 600 including a plurality of individual die 610A–610N and a barrier structure 620 on an outer edge of individual die pair 610 according to an embodiment of the present invention. FIG. 7 illustrates an example individual die pair 610 including a barrier structure 620 on an outer edge of bonded die according to an embodiment of the present invention. As shown in FIG. 7, the die pair 610 including the bottom wafer 710 and the top wafer 720 each of which contains an identical set of metallic lines (metal bonding pads) 730A–730N arranged on opposing surfaces of adjacent wafers 710 and 720 to serve not only as electrical connections to active IC devices on adjacent wafers 710 and 720 but also to bond the adjacent wafers 710 and 720. Each of the adjacent wafers 710 and 720 also contains one or more barrier lines deposited on the perimeter of the die which, when the wafers 710 and 720 are bonded, form a barrier structure 620 to confine the oxidation of exposed metal bonding pads and to provide for additional mechanical strength near the saw cut as shown in FIG. 8.

According to an embodiment of the present invention, the die barrier structure 620 may be formed by a single guard ring (barrier line) or multiple concentric guard rings (barrier lines) used to provide for effective passivation for the metallic lines (metal bonding pads) 730A–730N which are exposed to ambient after the die sawing process. Similar to the barrier structure 520 used for the entire wafer pair 500 at the wafer level as described with reference to FIGS. 5A–5B, the guard rings 620 may be continuous copper (Cu) lines around the perimeter of Cu diffusion bonded stacked die with oxide recess to provide for both corrosion resistance and mechanical strength. The Cu guard rings can provide effective passivation at no process cost and only minimal area cost, i.e. only a couple microns wide and can be positioned in the scribe line. As previously described with reference to FIGS. 5A–5B, copper (Cu) may be selected because of its low electrical resistivity, high electromigration resistance and high diffusivity. However, other metallic materials can also be used, including, for example, gold and tin and tin alloy.

Multiple guard rings 620 can also offer the additional benefit of additional backup layers for containment of both oxygen and water. For example if the outer guard ring becomes sufficiently oxidized to make it permeable to oxygen, the second, third, fourth and fifth layers can still provide for effective passivations. For multiple guard rings 620, the concept of a sacrificial guarding getting low levels of oxygen is also possible. In addition, the orientation of the guard rings 620 parallel to the perimeter not only enables them to serve as passivation barriers, but also permits them to extend all the way into the saw cut since the guard rings 620 are self contained and will not serve as to promote delamination.

As described in this invention, the barrier structure as shown in FIGS. 5A–5B and 6–8 according to an embodiment of the present invention can be erected, independently or in combination, for both the bonded wafer pair or individual die pair to effectively protect internal die from corrosion and contamination caused by wafer thinning techniques or generated by other processing steps after the wafers are bonded, and to provide additional structural support for crack propagation control when the bonded wafer pair 500 is cut into individual die.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A three-dimensional (3-D) integrated chip system, comprising:
    a first wafer including one or more integrated circuit (IC) devices, metallic lines deposited via an interlevel dielectric (ILD) on a surface, and at least one barrier line deposited on an outer edge of the surface; and
    a second wafer including one or more integrated circuit (IC) devices, metallic lines deposited via an interlevel dielectric (ILD) on a surface, and at least one barrier line deposited on an outer edge of the surface, wherein the metallic lines and the barrier line deposited on the surface of the second wafer are bonded with the metallic lines and the barrier line deposited on the surface of the first wafer to establish electrical connections between active IC devices on adjacent wafers and to form a barrier structure on the outer edge of the adjacent wafers.

2. The three-dimensional (3-D) integrated chip system as claimed in claim 1, wherein the metallic lines include Copper (Cu) bonding pads deposited on opposing surfaces of the adjacent wafers to serve as electrical contacts between active IC devices on both the adjacent wafers.

3. The three-dimensional (3-D) integrated chip system as claimed in claim 1, wherein the bonded wafers includes a plurality of individual die and the barrier structure is formed to protect internal die from corrosion, contamination and crack propagation when the bonded wafers are cut into individual die.

4. The three-dimensional (3-D) integrated chip system as claimed in claim 3, wherein the barrier structure is a dense grid of connected copper (Cu) lines in a checkerboard pattern erected on the outer edge of usable die.

5. The three-dimensional (3-D) integrated chip system as claimed in claim 4, wherein the barrier structure is erected on the outer edge of usable die using an edge reticle.

6. The three-dimensional (3-D) integrated chip system as claimed in claim 1, wherein the bonded wafers correspond to a single die and the barrier structure is formed by one or more barrier lines deposited on the outer edge of the bonded die to protect the bonded die from corrosion, contamination and crack propagation.

7. The three-dimensional (3-D) integrated chip system as claimed in claim 6, wherein the barrier lines correspond to concentric copper (Cu) guard rings deposited on the perimeter of the bonded die to serve as passivation barriers.

8. A three-dimensional (3-D) integrated chip system, comprising:
    a first wafer including one or more active integrated circuit (IC) devices;
    a second wafer including one or more active integrated circuit (IC) devices;
    first metallic lines deposited on opposing surfaces of the first and second wafers at designated locations to serve as wafer bonding pads and to establish electrical connections between active IC devices on the first and second wafers, when the first and second wafers are bonded; and
    second metallic lines deposited on an outer edge of opposing surfaces of the first and second wafers to form a barrier structure, when the first and second wafers are bonded.

9. The three-dimensional (3-D) integrated chip system as claimed in claim 8, wherein the first metallic lines include a plurality of Copper (Cu) bonding pads deposited on opposing surfaces of the adjacent wafers to serve as electrical contacts between active IC devices on both the adjacent wafers.

10. The three-dimensional (3-D) integrated chip system as claimed in claim 8, wherein the second metallic lines include a plurality of Copper (Cu) barrier lines deposited on the outer edge of the adjacent wafers to protect active IC devices from corrosion and contamination.

11. The three-dimensional (3-D) integrated chip system as claimed in claim 8, wherein the barrier structure is a dense grid of connected copper (Cu) lines in a checkerboard pattern erected on the outer edge of usable die within bonded wafers.

12. The three-dimensional (3-D) integrated chip system as claimed in claim 11, wherein the barrier structure is erected on the outer edge of usable die using an edge reticle.

13. The three-dimensional (3-D) integrated chip system as claimed in claim 8, wherein the bonded wafers correspond to a single die and the barrier structure is formed to protect the bonded die from corrosion, contamination and crack propagation.

14. The three-dimensional (3-D) integrated chip system as claimed in claim 13, wherein the second metallic lines correspond to concentric copper (Cu) guard rings deposited on the perimeter of the bonded die to serve as passivation barriers.

* * * * *